United States Patent
Farooq et al.

(10) Patent No.: US 9,536,829 B2
(45) Date of Patent: Jan. 3, 2017

(54) PROGRAMMABLE ELECTRICAL FUSE IN KEEP OUT ZONE

(71) Applicant: International Business Machines Corporation, Armonk, NY (US)

(72) Inventors: Mukta G. Farooq, Hopewell Junction, NY (US); Timothy D. Sullivan, Underhill, VT (US); Ping-Chuan Wang, Hopewell Junction, NY (US); Lijuan Zhang, Fremont, CA (US)

(73) Assignee: Internatonal Business Machines Corporation, Armonk, NY (US)

( * ) Notice: Subject to any disclaimer, the term of this patent is extended or adjusted under 35 U.S.C. 154(b) by 0 days.

(21) Appl. No.: 14/483,258

(22) Filed: Sep. 11, 2014

(65) Prior Publication Data

US 2016/0079166 A1    Mar. 17, 2016

(51) Int. Cl.
*H01L 23/58*  (2006.01)
*H01L 23/525*  (2006.01)
*H01L 23/48*  (2006.01)

(52) U.S. Cl.
CPC ......... *H01L 23/5256* (2013.01); *H01L 23/481* (2013.01); *H01L 23/585* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,100,118 A | 8/2000 | Shih et al. | |
| 6,162,686 A | 12/2000 | Huang et al. | |
| 6,368,902 B1 | 4/2002 | Kothandaraman et al. | |
| 6,444,503 B1 | 9/2002 | Yu | |
| 6,521,971 B2 * | 2/2003 | Tsai | H01L 23/5258 257/529 |
| 6,555,458 B1 | 4/2003 | Yu | |
| 6,716,679 B2 | 4/2004 | Bae | |
| 6,933,591 B1 | 8/2005 | Sidhu et al. | |
| 7,148,089 B2 | 12/2006 | Hung et al. | |
| 7,205,588 B2 | 4/2007 | Jeng et al. | |
| 7,633,136 B2 | 12/2009 | Yu | |
| 8,217,491 B2 | 7/2012 | Oshima et al. | |
| 8,232,648 B2 | 7/2012 | McGahay et al. | |
| 8,633,707 B2 | 1/2014 | Filippi et al. | |

(Continued)

FOREIGN PATENT DOCUMENTS

JP    2001156173 A    6/2001
WO    2014123620 A1    8/2014

*Primary Examiner* — Ali Naraghi
(74) *Attorney, Agent, or Firm* — Steven J. Meyers; Hoffman Warnick LLC

(57) ABSTRACT

An method including forming a back end of the line (BEOL) wiring portion directly on top of a semiconductor base portion, the BEOL wiring portion including a plurality of layers of a metallic material and a dielectric material and excluding a semiconductor material, forming a through-substrate via through the BEOL wiring portion and the semiconductor base portion, forming an electronic fuse in the BEOL wiring portion adjacent to the through-substrate via, and forming a guard ring in the BEOL wiring portion surrounding the through-substrate via and the electronic fuse in the BEOL wiring portion, the through-substrate via in the semiconductor base portion being free from the guard ring.

20 Claims, 14 Drawing Sheets

(56) References Cited

U.S. PATENT DOCUMENTS

| | | |
|---|---|---|
| 8,742,766 B2 | 6/2014 | Bonilla et al. |
| 2003/0189244 A1 | 10/2003 | Kim |
| 2008/0217735 A1 | 9/2008 | Chen et al. |
| 2012/0007213 A1 | 1/2012 | Choi et al. |
| 2012/0074520 A1 | 3/2012 | Yang et al. |
| 2012/0126363 A1 | 5/2012 | Wang et al. |
| 2013/0154048 A1* | 6/2013 | Lu .................. H01L 21/823481 257/496 |
| 2014/0167772 A1 | 6/2014 | Bonilla et al. |

* cited by examiner

SECTION A-A

SECTION A-A

SECTION A-A

PROGRAMMABLE ELECTRICAL FUSE IN KEEP OUT ZONE

BACKGROUND

The present invention relates generally to semiconductors, and, more particularly, to a programmable electrical fuse fabricated in close proximity to a through-substrate via.

A fuse is an electrical structure that is normally conducting and, with the application of a suitable electrical current, is "blown" to form an open circuit. For example, in integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electrical fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration effects to blow and create the open circuit. Electromigration can be defined as the transport of material caused by the gradual movement of ions in a conductor due to the momentum transfer between conducting electrons and diffusing metal atoms. In e-fuses that take advantage of electromigration effect, the transport of material caused by the gradual movement of ions can produce voids. These voids may cause the e-fuse to blow and create the open circuit or may cause an increase in resistance above a pre-set target.

However, in a typical e-fuse, electromigration may cause unpredictable voids; thus, potentially creating the open circuit in undesirable locations. Furthermore, typical e-fuse programming may require high programming currents and long programming times. Such programming currents and times may result in unpredictable void formation which may negatively affect other circuits adjacent to the e-fuse.

SUMMARY

According to one exemplary embodiment of the present invention, a method is provided. The method may include forming a back end of the line (BEOL) wiring portion directly on top of a semiconductor base portion, the BEOL wiring portion including a plurality of layers of a metallic material and a dielectric material and excluding a semiconductor material, forming a through-substrate via through the BEOL wiring portion and the semiconductor base portion, forming an electronic fuse in the BEOL wiring portion adjacent to the through-substrate via, and forming a guard ring in the BEOL wiring portion surrounding the through-substrate via and the electronic fuse in the BEOL wiring portion, the through-substrate via in the semiconductor base portion being free from the guard ring.

According to another exemplary embodiment of the present invention, a method is provided. The method may include forming a back end of the line (BEOL) wiring portion directly on top of a semiconductor base portion, the BEOL wiring portion comprising a plurality of layers of a metallic material and a dielectric material and excluding a semiconductor material, forming a first opening in the BEOL wiring portion, forming a second opening in the BEOL wiring portion adjacent to and surrounded by the first opening, the first opening and the second opening being separated by a distance, and filling the first opening with a material to form a guard ring. The method may further include filling the second opening with the material to form an electronic fuse, forming a through-substrate via opening through the BEOL wiring portion and the semiconductor base portion, the through-substrate via opening being surrounded entirely by the guard ring, the through silicon via opening through the semiconductor base portion being free of the guard ring, and depositing metallization in the through silicon via opening to form a through silicon via.

According to another exemplary embodiment of the present invention, a structure is provided. The structure may include a semiconductor base portion comprising a semiconductor material, a back end of the line (BEOL) wiring portion directly on top of the semiconductor base portion, the BEOL wiring portion comprising a plurality of layers of a metallic material and a dielectric material and excluding a semiconductor material, a through-substrate via extending through the BEOL wiring portion and the semiconductor base portion, an electronic fuse in the BEOL wiring portion adjacent to the through-substrate via, the electronic fuse and the through-substrate via are separated by a distance, and a guard ring in the BEOL wiring portion surrounding both the through-substrate via and the electronic fuse, the through-substrate via in the semiconductor base portion being free from the guard ring.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 1 illustrates forming an e-fuse and a guard ring in a back end of line portion of a semiconductor structure according to an exemplary embodiment.

FIG. 2 illustrates forming a TSV opening the back end of line portion of the semiconductor structure according to an exemplary embodiment.

FIG. 3 illustrates forming a TSV the back end of line portion of a semiconductor structure and a final e-fuse structure, according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
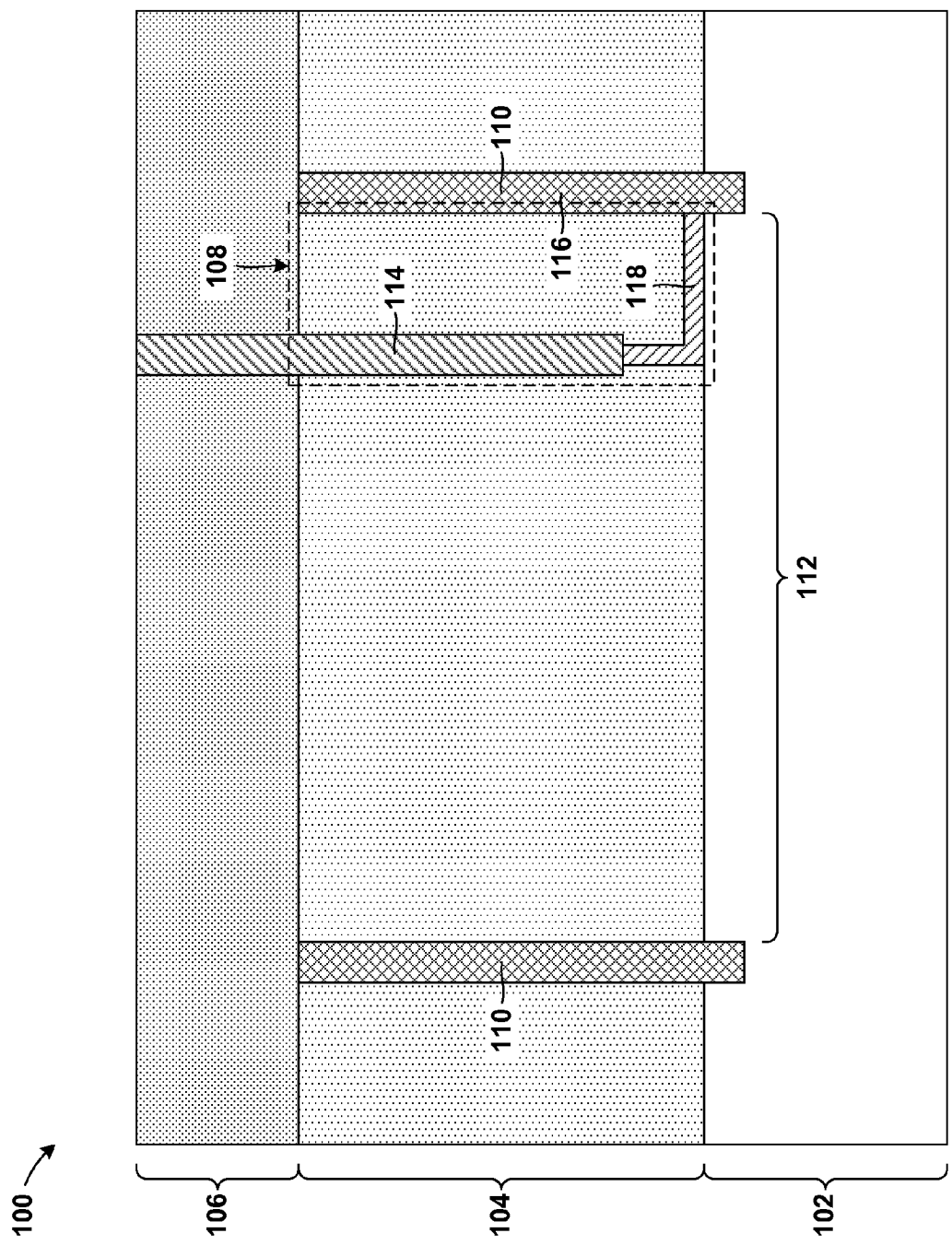
FIGS. 1-3 illustrate the steps of a method of forming an e-fuse, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductors, and, more particularly, to a programmable electrical fuse. The e-fuse structure may include a fuse link fabricated in close proximity to a through-substrate via. The electromigration reliability of such a fuse link may be degraded during formation of the through-substrate via in turn improving programmability.

Advantageously, the formation of the e-fuse structure of the present invention can be implemented in the back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present invention thus allows the e-fuse to be fabricated during normal interconnect process flows, thus advantageously reducing processing costs for manufacturing e-fuses which normally may require additional processes and different process flows.

More specifically, multilayer electronic components may include multiple layers of a dielectric material having metallization in each layer. Typically, the metallization may include a metal line and a via. The metallization of each dielectric layer may be formed using a filling technique such as electroplating, electroless plating, chemical vapor deposition, physical vapor deposition or a combination of methods. The metallization and dielectric layer may be capped with a cap dielectric, which may be, for example, a silicon nitride, silicon carbide, or a silicon carbon nitride ($SiC_xN_yH_z$) such as N-Blok. In the present case, the metallization of a particular dielectric layer, in a particular region, may be referred to as a fuse line as will be described in detail below.

By way of example, a typical e-fuse may include a first electrode connected to a second electrode by a fuse link. The fuse link generally having smaller cross sectional dimensions, or made from a different material, than either the first electrode or the second electrode. Typically, the above e-fuse configuration may rely on principles of electromigration for purposes of programming. A suitable programming current may range from about 5 mA to about 30 mA, and ranges there between. Alternatively, programming may be expressed as a threshold current density. For example, a typical current density of 100 $mA/cm^2$ may be required to program the e-fuse. Additionally, a circuit is considered to be programmed, and open, when the e-fuse resistance increases more than an order of magnitude over the initial pre-programmed resistance of the e-fuse. During programming of the e-fuse, one or more voids may form in unexpected locations due to non-optimized processing. Location of the voids may be uncontrollable and may affect the yield and reliability of the e-fuse. The voids may form in part due to the electromigration of conductive interconnect material within the e-fuse. An open circuit, created by a void in the fuse link, may be the desired result of programming the e-fuse, however, an open circuit, or void, in either of the electrodes may detrimentally affect other circuits that may be connected to either the first electrode or the second electrode.

Ideally, low programming currents and short programming times are preferable when programming an e-fuse. One way to achieve lower programming currents and shorter programming times may include encouraging electromigration and the formation of a void by intentionally forming a through-substrate via in close proximity to a fuse link. One embodiment by which to achieve lower programming currents and shorter programming times by fabricating a through-substrate via in close proximity to a fuse link is described in detail below by referring to the accompanying drawings FIGS. 1-6. In the present embodiment, a programmable electrical fuse may be fabricated between a through-substrate via and a guard ring.

Referring to FIGS. 1-6, cross section views of a structure 100 are shown. The structure 100 may represent a portion of a semiconductor chip. Referring now to FIG. 1, the structure 100 may include a semiconductor base portion 102 (hereinafter "base portion"), a back end of the line portion 104 (hereinafter BEOL portion"), and a far back end of the line portion 106 (hereinafter "far back end portion"). The base portion 102 employed in the present invention may include any semiconductor material including, but not limited to: undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. The base portion 102 may also include an organic semiconductor or a layered semiconductor such as Si/SiGe, a silicon-on-insulator (SOI) or a SiGe-on-insulator (SGOI). In the present embodiment, the base portion 102 has undergone front end of the line (FEOL) processing to fabricate various individual devices such as transistors, capacitors and the like. Such individual devices are not shown for clarity.

The BEOL portion 104 may include a plurality of layers of a metallic material and a dielectric material. More specifically, the BEOL portion 104 may include a plurality of dielectric layers (not shown) having metallic features or interconnects fabricated therein and embedded as metallization in one or more of the dielectric layers. The dielectric layers may include any type of dielectric material used for insulating a semiconductor device known to a person of ordinary skill in the art including, for example, a silicon dioxide substrate, a fluorinated silicon dioxide substrate, a silicon glass substrate, silicon dioxide, silicon nitride or SiCOH (a compound consisting of silicon, carbon, oxygen and hydrogen), or other low-k dielectric materials. The metallic features may typically include either copper, aluminum, or tungsten; however other conductive materials suitable for semiconductor fabrications are expressly contemplated herein. The precise details of the BEOL portion 104 are well known to those of ordinary skill in the art.

The far back end portion 106 may be substantially similar to the BEOL portion 104 in that the far back end portion 106 may be made of a plurality of dielectric layers having metallic features or interconnects fabricated therein and embedded as metallization in one or more of the dielectric layers. However, the interconnections fabricated within the far back end portion 106 may generally include larger pitch features used primarily to form electrical connections with components or devices external to the structure. In the present embodiment, the far back end portion 106 may include metallization and interconnect features used to form an electrical connection with features previously formed in the BEOL portion 104, or features that may be subsequently formed.

The structure 100 may further include an e-fuse 108 and a guard ring 110 which may be formed sequentially when the individual wiring layers of BEOL portion 104 are formed. The formation of the e-fuse 108 and the guard ring 110 will be discussed in more detail below. In an embodiment, the guard ring 110 may be a ring or fence of metallic material that encloses an area, or a keep-out zone 112, where a through silicon via will be formed. The guard ring 110 may extend part or the entire vertical length or thickness of the BEOL portion 104. In some cases, the guard ring 110 may partially extend into the base portion 102, as illustrated. In most cases, the guard ring 110 may be in direct contact with, and as such electrically grounded to, the base portion 102. It should be noted that the guard ring typically does not extend through the entire base portion 102. In an embodiment, the e-fuse 108 may include a typical interconnect structure fabricated within the keep-out zone 112 defined by the guard ring 110. In the present embodiment, the e-fuse 108 may include a first electrode 114, a second electrode 116, and a fuse link 118. It should be noted that in the present embodiment the guard ring 110 may serve or function as the second electrode 116 of the e-fuse 108. Stated differently, the guard ring 110 and the second electrode 116 of the e-fuse 108 are the same structure. As mentioned above, specific details of the formation of the e-fuse 108 and the guard ring 110 will be discussed below.

Figure 2:
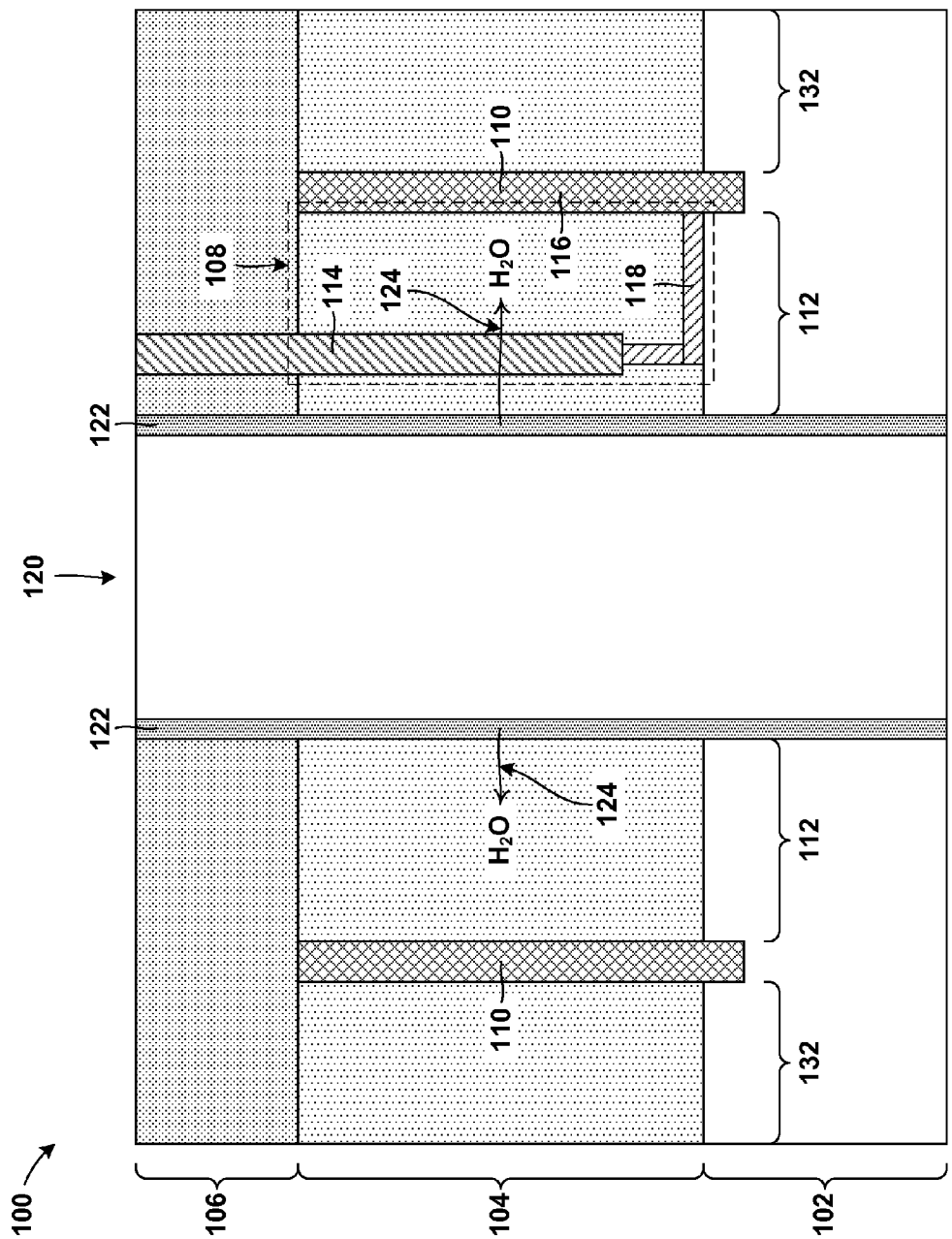

Referring now to FIG. 2, a through-substrate via opening 120 (hereinafter "TSV opening") may be conventionally etched through the far back end portion 106, the BEOL portion 104, and the base portion 102. The location of the TSV opening 120 may be chosen so as to be within the keep-out zone 112 surrounded by the guard ring 110. While the TSV opening 120 is shown as being etched entirely through the far back end portion 106, the BEOL portion 104, and the base portion 102, it is within the scope of the present invention for the TSV opening 120 to be etched only partially through the far back end portion 106, the BEOL portion 104 and/or the base portion 102. It should be noted that the TSV opening 120 may not intersect or interfere with either the e-fuse 108 or the guard ring 110. Furthermore, the e-fuse 108 may be positioned or located between the TSV opening 120 and the guard ring 110.

A first liner 122 may then be deposited on the walls of the TSV opening 120. In one technique for depositing the first liner 122, O3/TEOS (Tetraethyl orthosilicate) may be used. The first liner 122 may have a thickness of about 1 µm. Water, a potential byproduct of the formation of the first liner 122, may migrate into the dielectric material of the BEOL portion 104, as indicated by arrows 124. Water can be detrimental to the dielectric material of the BEOL portion 104, particularly where the dielectric material includes a so-called low dielectric constant (low-k) material. However, the guard ring 110 may block any water that may be present, from diffusing further into the dielectric material of the BEOL portion 104. In general, because of the presence of water and the high potential for unexpected interconnect failure, any wiring layers of the BEOL portion 104 located between the TSV opening 120 and the guard ring 110, otherwise located in the keep-out zone 112, may be, by design, nonfunctional. Stated differently, any wiring layers of the BEOL portion 104 located inside or within the keep-out zone 112 are segregated from the remainder of the structure 100 by the guard ring 110 and as such may be nonfunctional in nature.

In part, for the above reasons, the e-fuse 108 of the present embodiment may be intentionally located within the keep-out zone 112. More specifically, the fuse link 118 of the e-fuse 108 may be fabricated in the keep-out zone 112 where it may be prone to failure. As mentioned above, water that has diffused into the keep-out zone 112 may cause damage to any wiring layers in the keep-out zone 112. More specifically, in the present embodiment, the water may cause damage to the fuse link 118. As is well known in the art, programming of the e-fuse 108 may be controlled by the application of a programming current. Generally, any damage to the fuse link 118 caused by the presence of water may be intensified or worsened when the programming current is applied. This may cause the resistance of the fuse link 118 to increase more than an order of magnitude over the initial pre-programmed resistance of the e-fuse 108.

Figure 3:
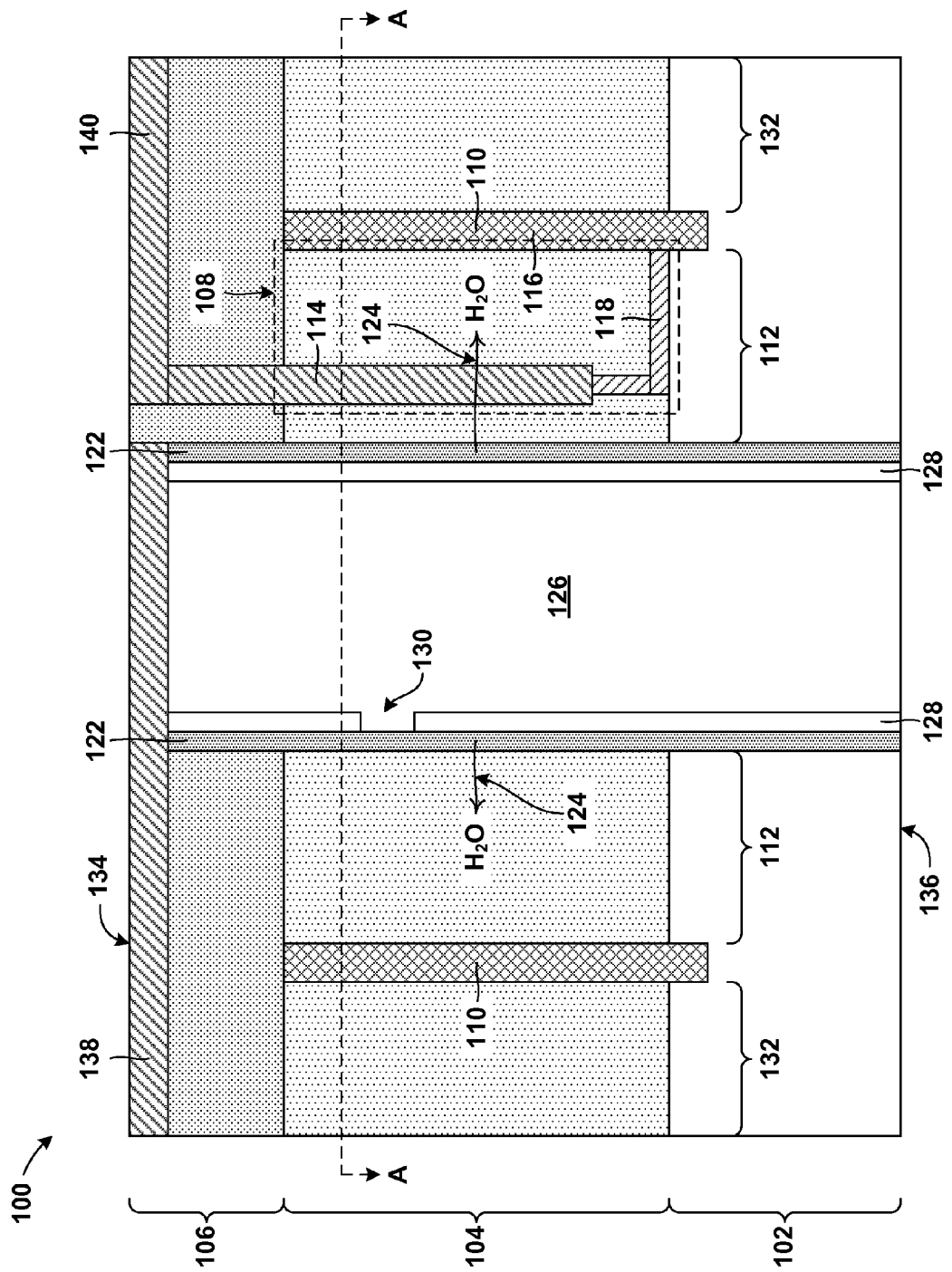

Referring now to FIG. 3, a conductive material, for example copper, may be deposited within and may substantially fill the TSV opening 120 (FIG. 2) to form a through-substrate via 126 (hereinafter "TSV"). The conductive material may be deposited within the TSV opening 120 (FIG. 2) using typical deposition techniques known in the art, such as, for example, chemical vapor deposition, physical vapor deposition, plasma enhanced chemical vapor deposition, or similar. A second liner 128, such as Ta/TaN may alternatively be deposited directly on top of the first liner 122 before filling the TSV opening 120 (FIG. 2) with the conductive material. The second liner 128 may have a thickness ranging from about 10 nm to about 100 nm. It should be noted that a portion of the TSV 126 located in the base portion 102 is not surround by and is free from the guard ring 110.

In an embodiment, the second liner 128 may fail to completely cover a sidewall of the TSV opening 120 (FIG. 2), as indicated by a gap 130. In this instance, the conductive material of the TSV 126, particularly copper, may diffuse into the wiring layers of the BEOL portion 104. However, the presence of the guard ring 110 may also prevent the conductive material of the TSV 126 from migrating out and contaminating a functional portion 132 of the wiring layers of the BEOL portion 104. The function portion 132 of the of the wiring layers of the BEOL portion 104 may include, as compared to the keep-out zone 112, portions of the BEOL portion 104 located "outside," or exterior of the guard ring 110. In another embodiment, the second liner 128 may be omitted because any migration of the metallic material of the TSV 126 into the functional portion 132 of the BEOL portion 104 would be prevented by the guard ring 110.

Like the TSV opening 120 above, the TSV 126 may extend entirely through the far back end portion 106, the BEOL portion 104, and the base portion 102. In other embodiments, the TSV 126 may extend only partially through the far back end portion 106, the BEOL portion 104, and/or the base portion 102. It should be noted that the TSV 126 may extend continuously through the far back end portion 106, the BEOL portion 104, and the base portion 102. By "continuously", it is meant that the TSV 126 extends through the structure 100 from or near an upper surface 134 of far back end portion 106 to or near a lower surface 136 of the base portion 102 in a substantially straight path without any jogs to the side.

In addition to forming the TSV 126, a TSV wire 138 and a fuse wire 140 may be formed in the far back end portion 106. The TSV wire 138 and the fuse wire 140 may be formed using techniques well known in the art. For example, a single damascene technique may be used to fabricate the TSV wire 138 and the fuse wire 140. In general, the TSV wire 138 may be any metallic interconnection which may form an electrical connection to and/or from the TSV 126. Similarly, the fuse wire 140 may be any metallic interconnection which may form and electrical connection to and/or from the e-fuse 108. In the present embodiment, the TSV wire 138 and the fuse wire 140 may not be in direct electrical contact with one another; however, it is conceivable that they are part of a single larger electrical circuit.

Figure 4:
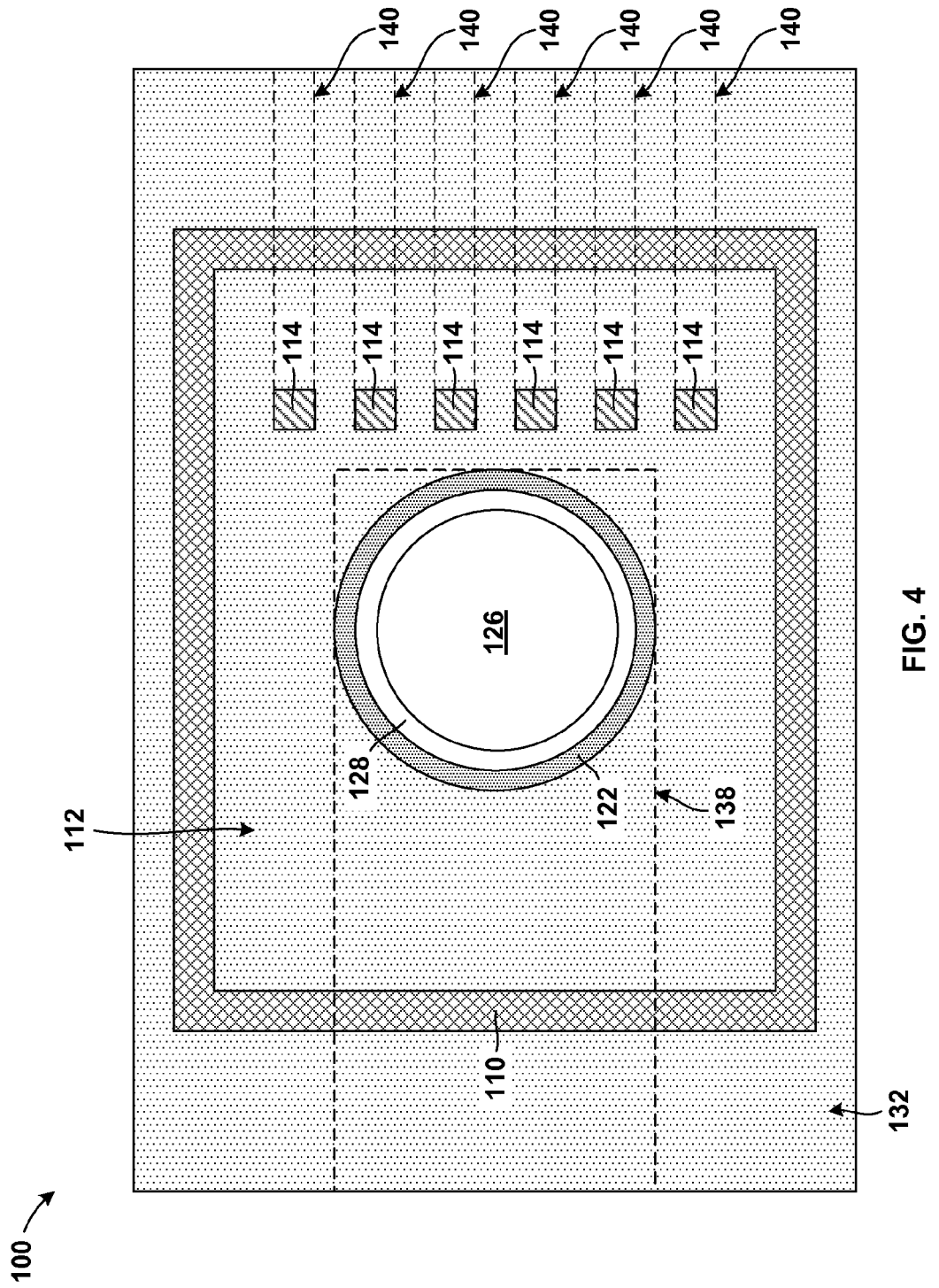
FIG. 4 is a cross section view along section line A-A of the structure in FIG. 3, according to an exemplary embodiment.
Figure 5:
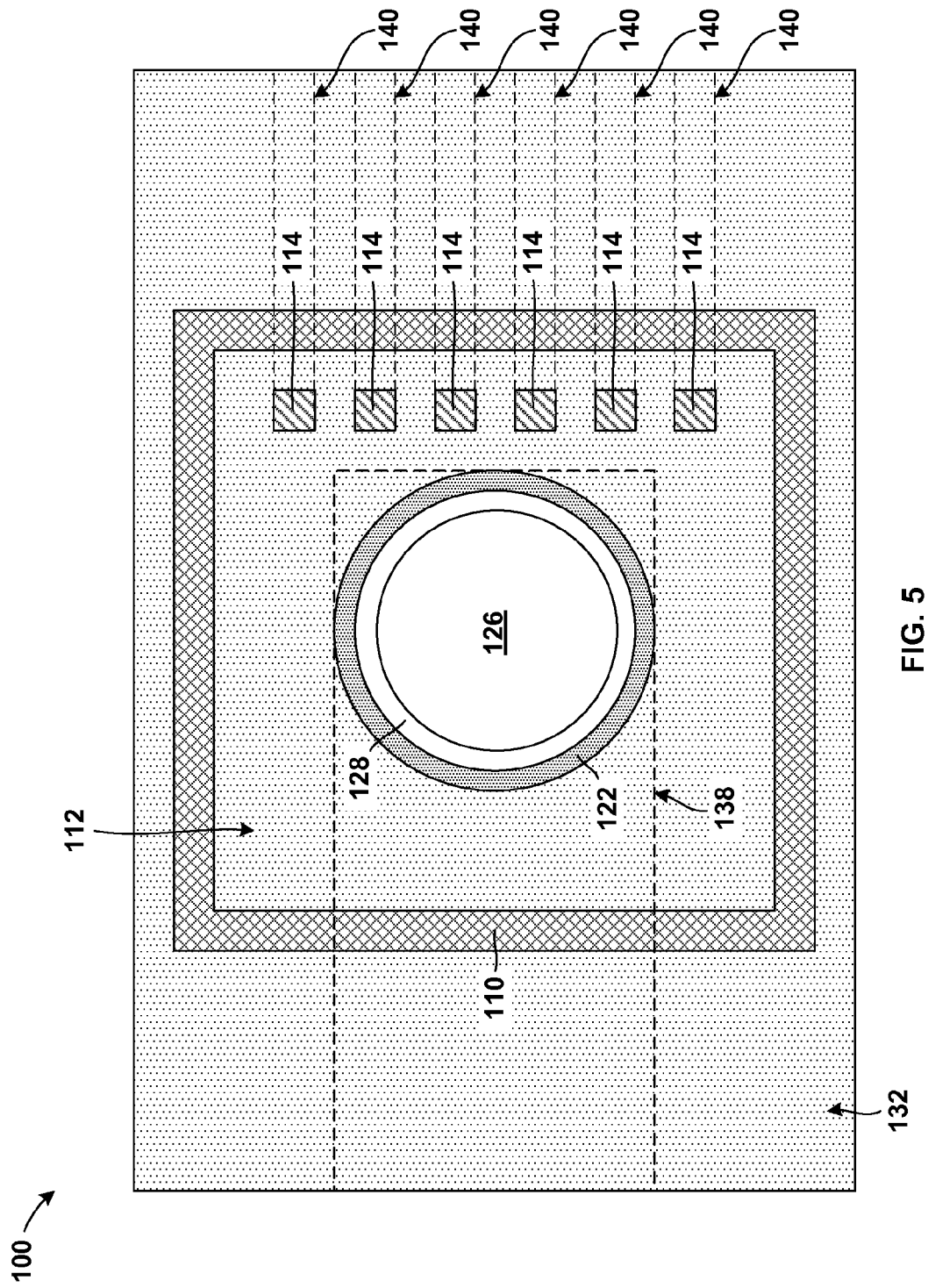
FIG. 5 is a cross section view along section line A-A of the structure in FIG. 3, according to an exemplary embodiment.
Figure 6:
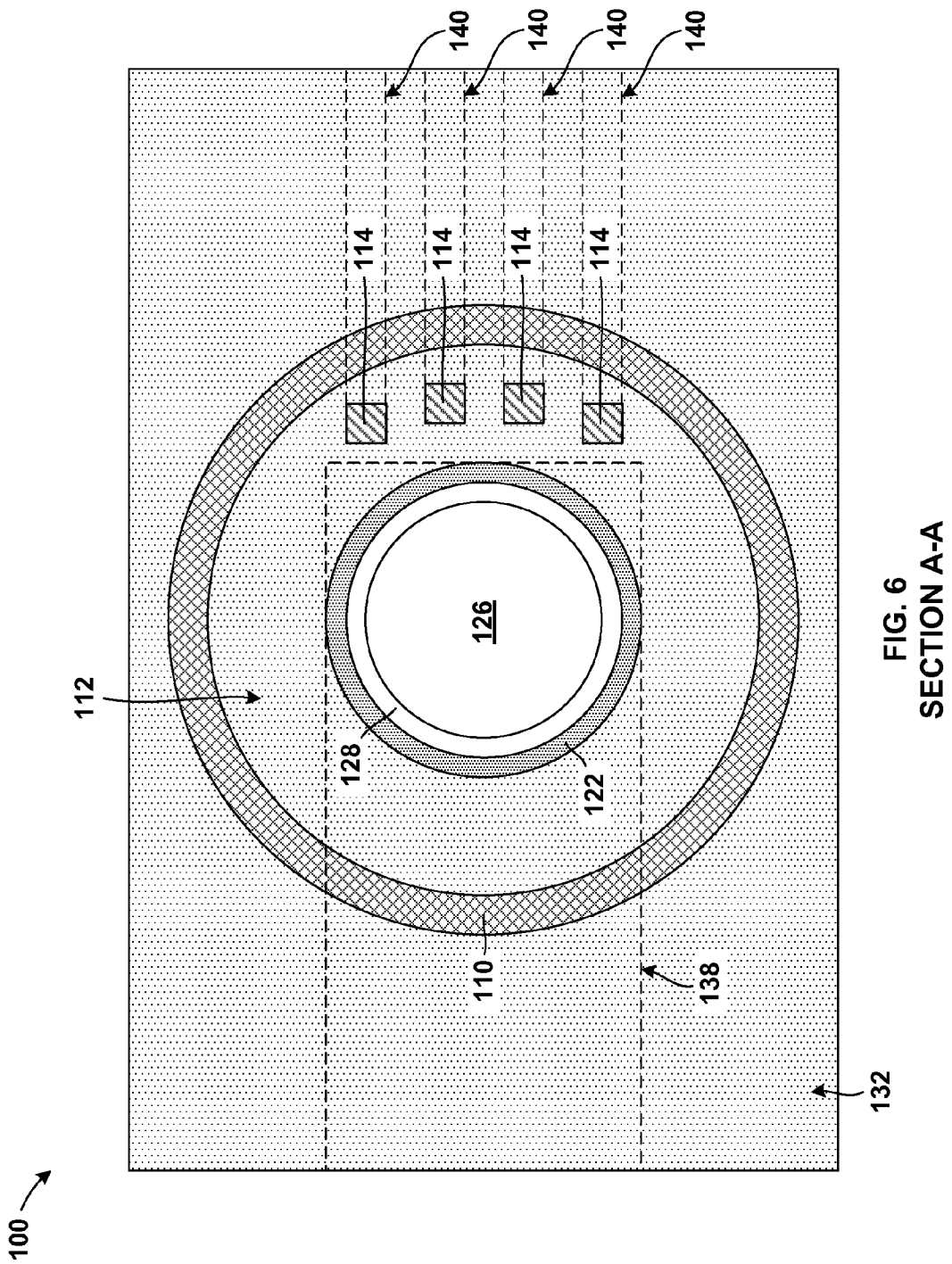
FIG. 6 is a cross section view along section line A-A of the structure in FIG. 3, according to an exemplary embodiment.

Referring now to FIGS. 4-6, cross sectional views of the structure 100 of FIG. 3, along a section line A-A (FIG. 3), are shown. The following cross sectional views illustrate various forms and shapes of the guard ring 110 which may be used and tailored to fit varying needs of different semiconductor designs. It should be noted that the variety of shapes and sizes of the guard ring 110 are unlimited; however only a limited number of shapes and sizes may be illustrated in the figures. In an embodiment, illustrated in FIG. 4, the guard ring 110 may have a substantially rectangular cross sectional shape. In an embodiment, illustrated in FIG. 5, the guard ring 110 may have a substantially square cross sectional shape. In an embodiment, illustrated in FIG. 6, the guard ring 110 may have a substantially circular cross sectional shape. The TSV 126 may be solid as illustrated in FIGS. 4 and 5. Alternatively, the TSV 126 may be an annulus or a ring.

The dimensions of the guard ring 110 and TSV 126 may vary depending on the design requirements of the semiconductor chip. In an embodiment, for example, for purposes of illustration and not limitation, the TSV 126 may have an outside diameter of about 17 μm, the guard ring 110 may have an outside dimension of 20 μm by 20 μm, and the guard ring 110 may have a thickness of about 1 μm. It should be noted that any combination of the above shapes, sizes and configurations is explicitly contemplated herein. The e-fuse 108 of the present embodiment may effectively lower the required programming current and shorten the programming time, thereby increasing programming reliability and efficiency.

Figure 7:
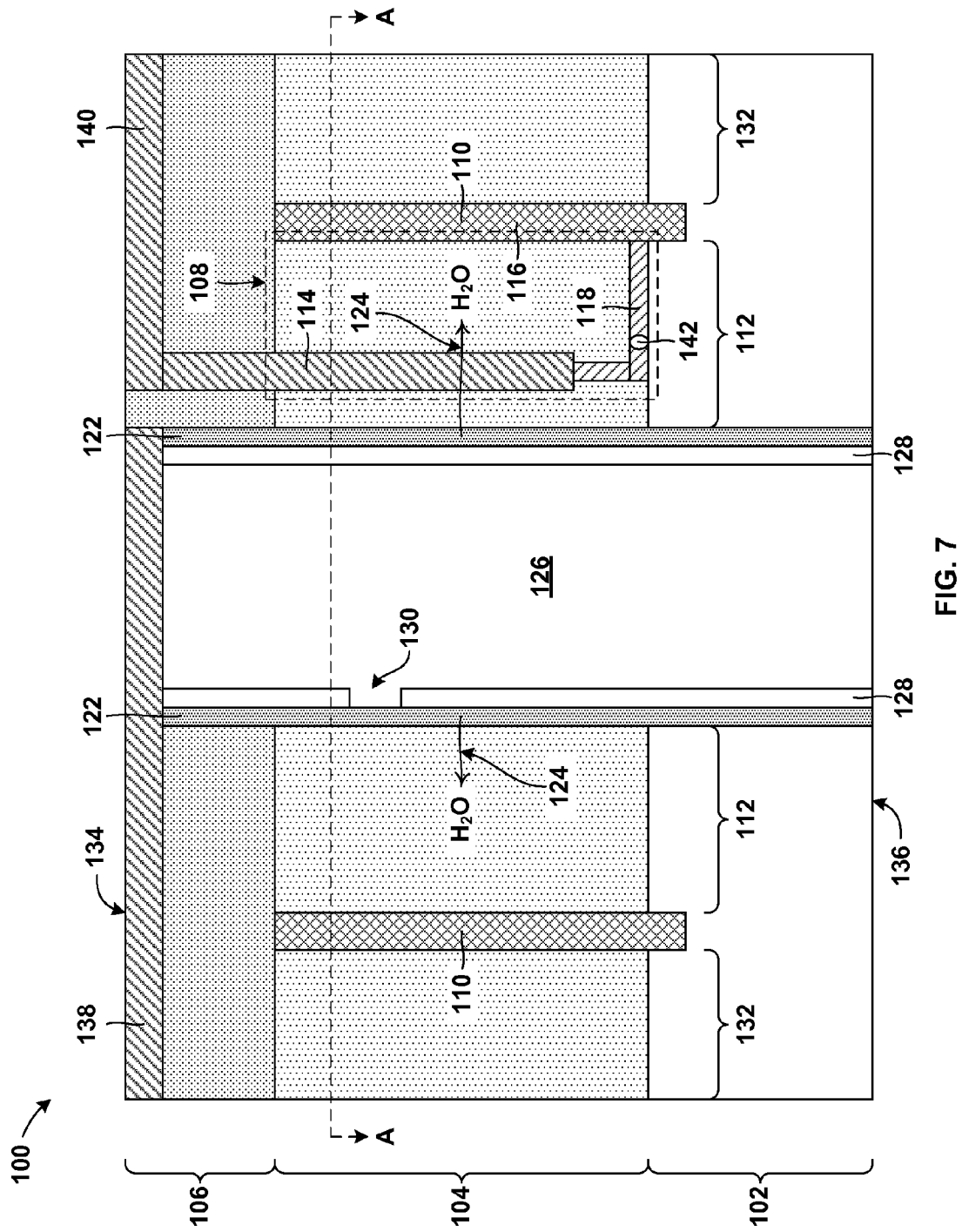
FIG. 7 illustrates a final e-fuse structure after programming, according to an exemplary embodiment.

Now referring to FIG. 7, the structure 100 is shown in which the e-fuse 108 has been programmed and a void 142 has formed in the fuse link 118. The goal or intention of programming may be to create a disconnection between the first electrode 114 and the second electrode 116. Lower programming currents may be used to program the e-fuse 108 of the structure 100 because of (1) the location and positioning of the fuse link 118 inside or within the keep-out zone 112 and (2) the reduced width and/or height of the fuse link 118. For example, a programming current ranging from about from about 2 mA to about 15 mA may be used to program the e-fuse 108 of the present embodiment. The damage caused by the water present in the keep-out zone 112 combined with smaller dimensions of the fuse link 118 may locally increase the electromigration diffusivity and the current density of the fuse link 118. As a result of the increased diffusivity and current density, the conductive material of the fuse link 118 may be susceptible to electromigration and subsequent void formation under an applicable flow of current. Heat may also be a result of the increase current density of which may further enhance electromigration and the possibility of void formation. Because the second electrode 116 of the present embodiment may be the guard ring 110, the e-fuse 108 of the present embodiment may be used for programming, or disconnecting, for example, a particular ground signal.

In part, for the above reasons, the e-fuse 108 of the present embodiment may be intentionally located within the keep-out zone 112. More specifically, the fuse link 118 of the e-fuse 108 may be specifically fabricated in the keep-out zone 112, where it may purposefully be prone to failure. As mentioned above, water which has diffused into the keep-out zone 112 may cause damage to any wiring layers in the keep-out zone 112, and more specifically in the present embodiment, may cause damage to the fuse link 118. As is well known in the art, programming of the e-fuse 108 may be controlled by the application of a programming current. Generally, any damage to the fuse link 118 caused by the presence of water may be intensified or worsened when the programming current is applied, thus causing the resistance of the fuse link 118 to increase more than an order of magnitude over the initial pre-programmed resistance of the e-fuse 108. Therefore, because of damage to the fuse link 118 caused by the presence of water, the e-fuse may be programmed in less time and with lower total power which may produce better efficiency and higher yields. Lower total power also reduces the potential to damage neighboring devices. Therefore, locating the fuse link 118 in the keep-out zone 112 may be at least partially responsible for the lower programming currents and shorter programming times.

In addition, the fuse link 118 may have a reduced width and/or height, relative to a nominal width and or height, of either the first electrode 114 or the second electrode 116. One benefit of the reduced width and/or height of the fuse link 118 is that a smaller void, for example the void 142, may also cause the resistance of the fuse link 118 to increase more than an order of magnitude over the initial pre-programmed resistance of the e-fuse 108. Therefore, because a smaller void may cause the requisite increase in resistance, the e-fuse may be programmed in less time and with lower total power, which may produce better efficiency and higher yields. Lower total power also reduces the potential to damage neighboring devices. Therefore, the reduced width and/or height of the fuse link 118 may be at least partially responsible for the lower programming currents and shorter programming times.

Similarly, as described in an embodiment above, lower programming currents may be achieved by fabricating the fuse link 118 out of a different material than either the first electrode 114 or the second electrode 116. Doing so would intentionally exploit the electromigration characteristic of each of the different materials to induce the formation of, for example, the void 142.

Figure 8:
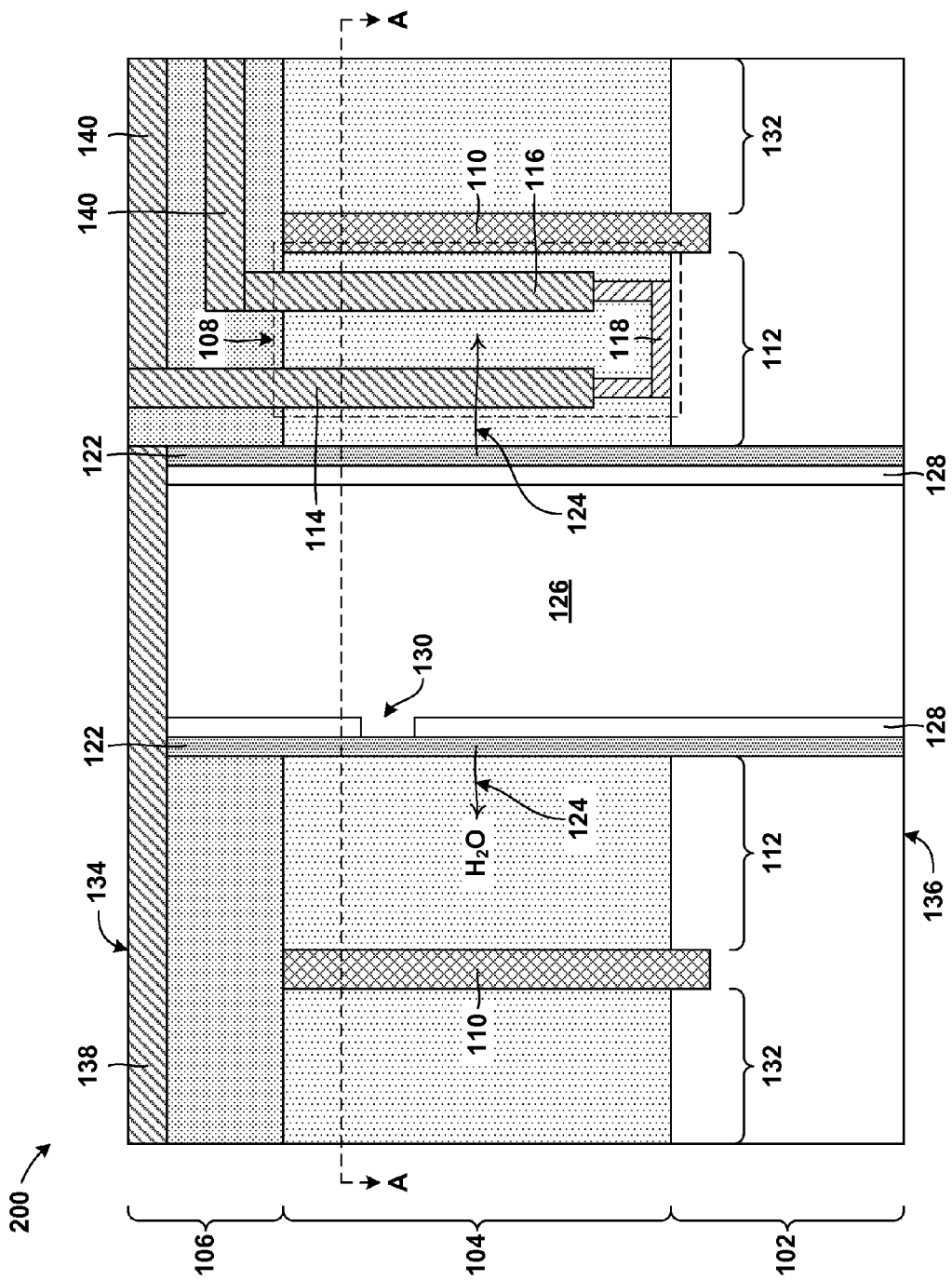
FIG. 8 illustrates a final e-fuse structure, according to an exemplary embodiment.

Referring now to FIG. 8, according to another embodiment, the e-fuse 108 described above may have a slightly different wiring configuration as shown in a structure 200. Like above, the e-fuse 108 may include the first electrode 114, the second electrode 116, and the fuse link 118. It should be noted that in the present embodiment, unlike above, the second electrode 116 is a separate structure independent from the guard ring 110. It should be noted that the e-fuse 108 of the present embodiment, including the alternative wiring configuration, may also be used to achieve lower programming currents and shorter programming times by fabricating the fuse link 118 in close proximity to the TSV 126, just as described in detail above. Again, specific details of the formation of the e-fuse 108 and the guard ring 110 will be discussed below. Because the first electrode 114, the second electrode 116, and the fuse link 118 of the present embodiment are electrically independent of the guard ring 110 or TSV 126, the e-fuse 108 of the present embodiment may be used for programming, or disconnecting, for example, any electrical signal or circuit.

Figure 9:
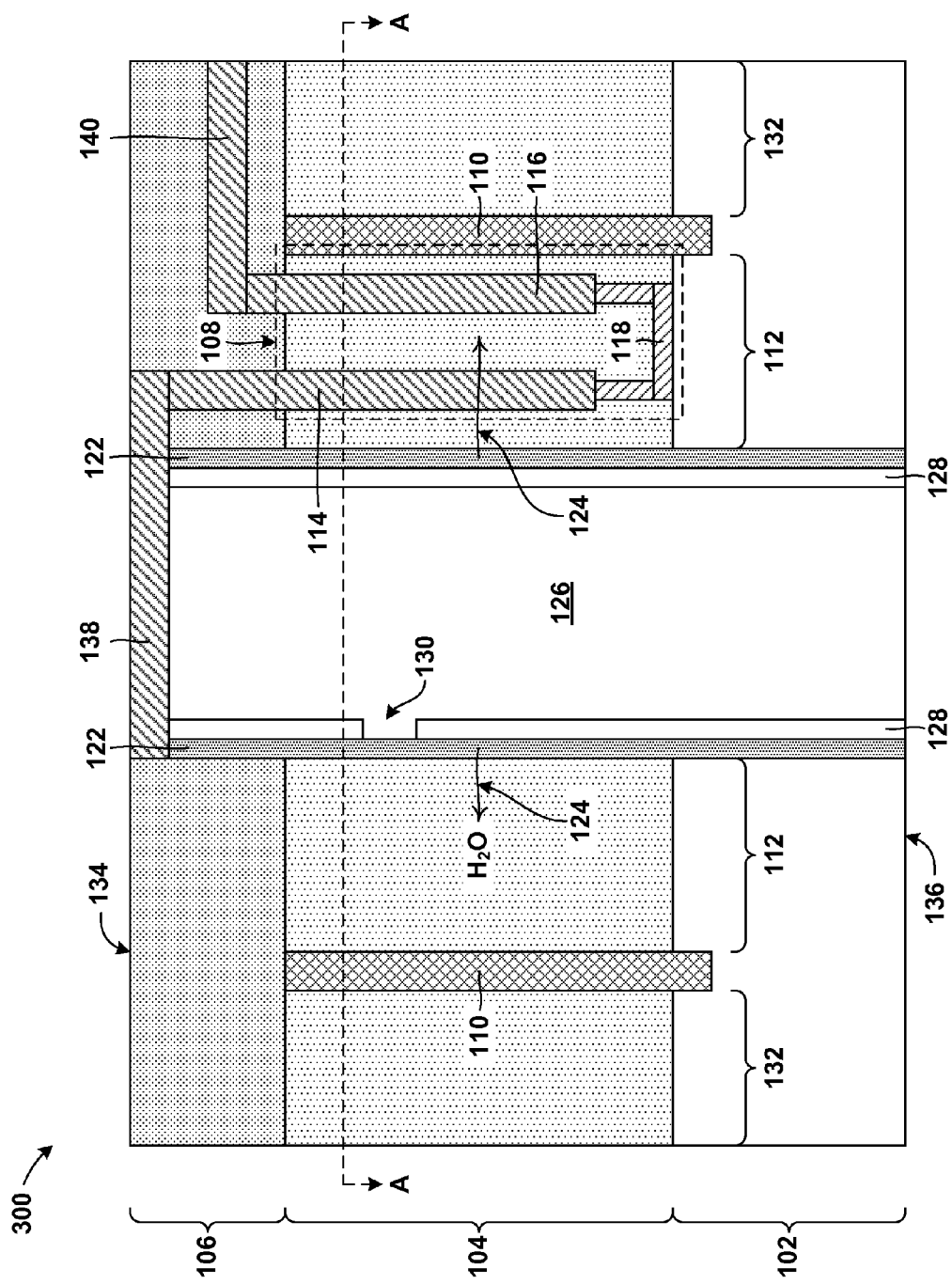
FIG. 9 illustrates a final e-fuse structure, according to an exemplary embodiment.
Figure 10:
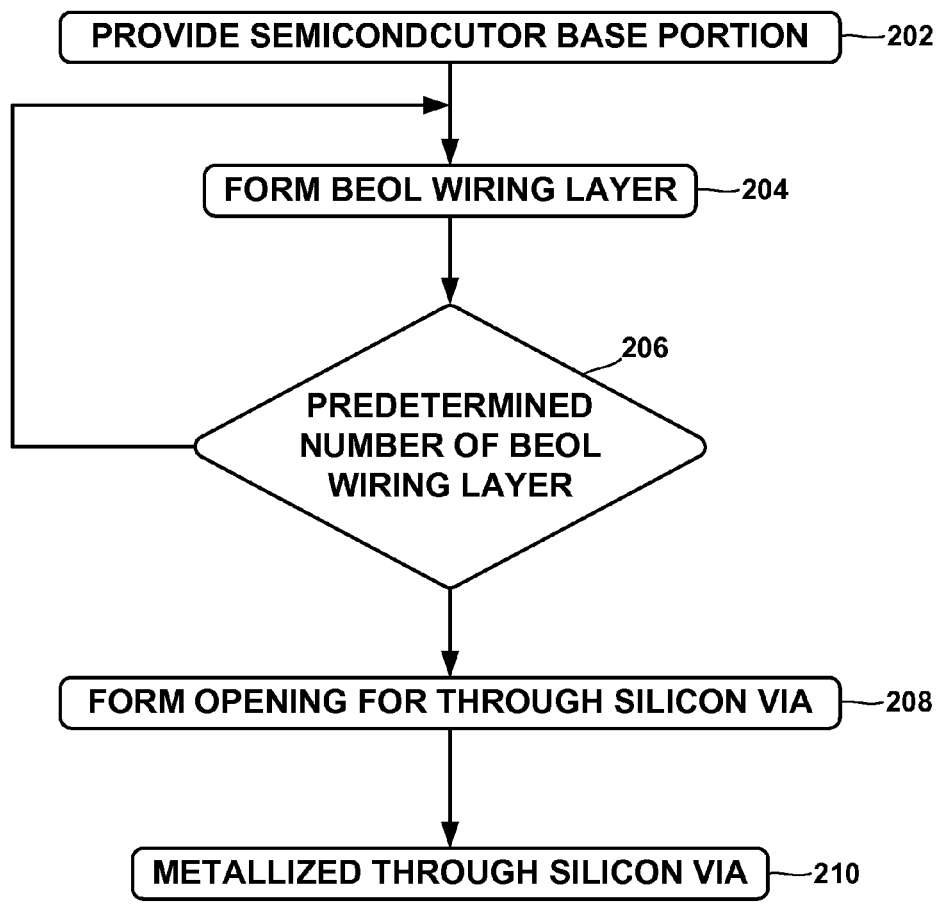
FIG. 10 is a flow chart illustrating the method of forming the e-fuse structure, according to an exemplary embodiment.

Referring now to FIG. 9, according to another embodiment, the e-fuse 108 described above may have a slightly different wiring configuration as shown in a structure 300. Like above, the e-fuse 108 may include the first electrode 114, the second electrode 116, and the fuse link 118. It should be noted that in the present embodiment, unlike above, the TSV wire 138 may be used to electrically connect the first electrode 114 to the TSV 126. It should be noted that the e-fuse 108 of the present embodiment, including the alternative wiring configuration, may also be used to achieve lower programming currents and shorter programming times by fabricating the fuse link 118 in close proximity to the TSV 126, just as described in detail above. Again, specific details of the formation of the e-fuse 108 and the guard ring 110 will be discussed below. Because the first electrode 114 of the present embodiment is directly connected to the TSV 126, the e-fuse 108 of the present embodiment may be used for programming, or disconnecting, for example, the TSV 126.

Figure 11:
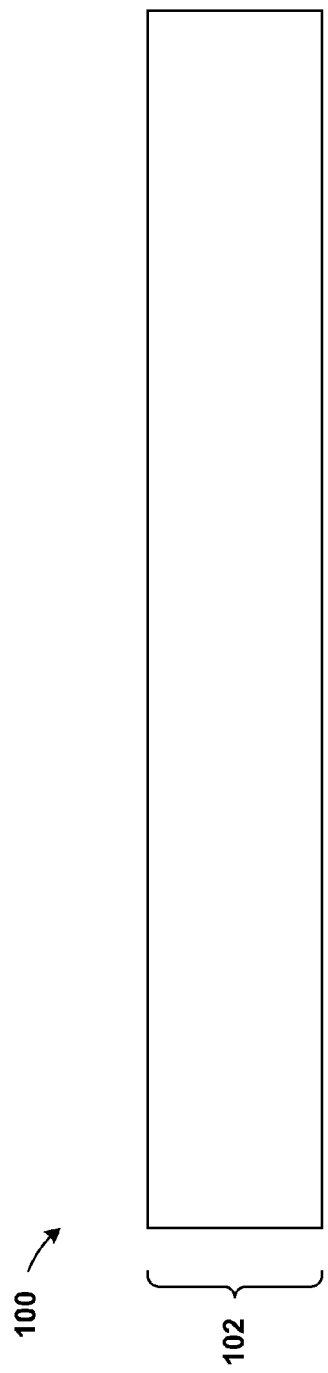
FIG. 11 depicts a base portion of a semiconductor substrate, according to an exemplary embodiment.

Referring now to FIG. 10 and FIGS. 11-15, a method of forming the above structure 100 of FIG. 3, having the e-fuse 108, the guard ring 110, and the TSV 126 is shown in more detail and will be described below. It should be noted that a substantially similar method may also be used to fabricate the structures 200 and 300 of FIGS. 8 and 9, respectively. At step 202 of FIG. 10, the base portion 102 is provided as shown in FIG. 11. That is, the base portion of the semiconductor wafer may be prepared with all of the necessary semiconductor devices such as transistors, capacitors and the like. It should be understood that only a portion of the base portion 102 is shown in FIG. 11.

Figure 12:
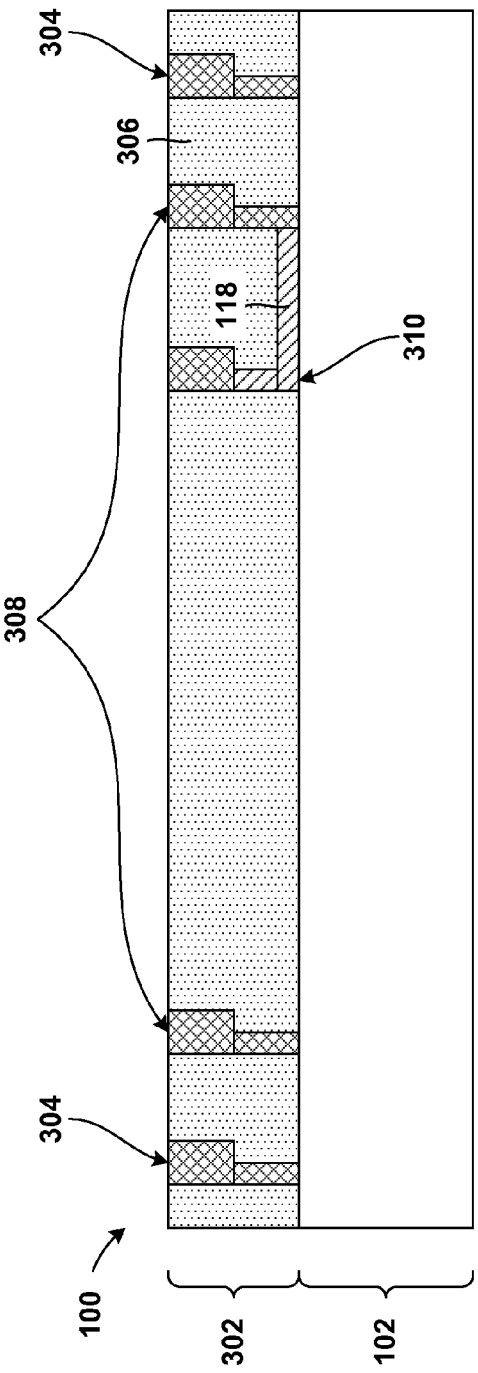
FIG. 12 illustrates forming a first BEOL wiring layer on the base portion of the semiconductor substrate, according to an exemplary embodiment.

Next, at step 204 and as shown in FIG. 12, a first BEOL wiring layer 302 may be formed on top of the base portion 102, including metallization 304 and a dielectric material 306. It is noted that the metallization 304 of the BEOL wiring layer 302 may include a guard ring portion 308 which will perform no electrical function in the BEOL wiring 302. The metallization 304 of BEOL wiring layer 302 may further include a fuse portion 310 which will ultimately form the first electrode 114 (FIG. 3) of the e-fuse 108 (FIG. 3). In addition, the fuse link 118 may be formed as metallization in the first, or lowermost, BEOL wiring layer 302 as illustrated. The formation of the BEOL wiring layer 302 and all subsequent BEOL wiring layers are by conventional methods, such as, for example, typical single or dual damascene processing.

Figure 13:
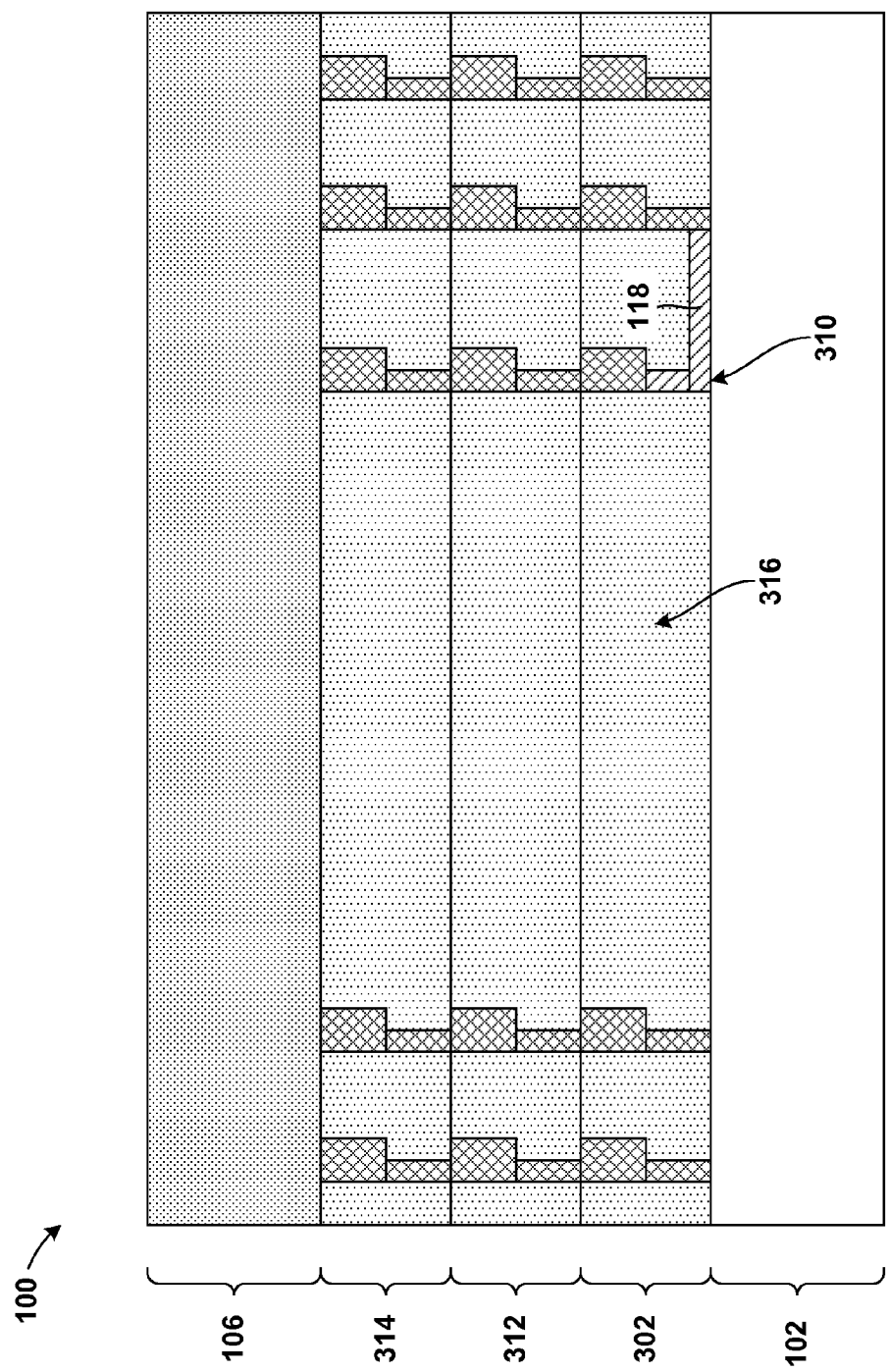
FIG. 13 illustrates forming additional BEOL wiring layers and a far back end portion, according to an exemplary embodiment.

At step 206, and as shown in FIG. 13, additional BEOL wiring layers may be formed until a predetermined number of BEOL wiring layers are formed to meet the design requirements of the semiconductor chip. Although FIG. 13 shows only two additional BEOL wiring layers 312 and 314, in practice there will usually be more such BEOL wiring layers formed. It is to be noted that the guard ring portions 308, and similarly the fuse portions 310, of each BEOL wiring layer may be stacked on top of the guard ring portions 308 and the fuse portions 310 of the preceding BEOL wiring layer. The various guard ring portions 308 form, for example, a continuous square, rectangular, circular or other shape, as discussed above, and illustrated in FIGS. 4-6 above. Within the guard ring portions 308 is an open area 316 where the e-fuse 108 (FIG. 3) and the TSV 126 (FIG. 3) may be formed. The far back end portion 106 may typically be formed directly on top of the last BEOL wiring layer 314, as illustrated.

Figure 14:
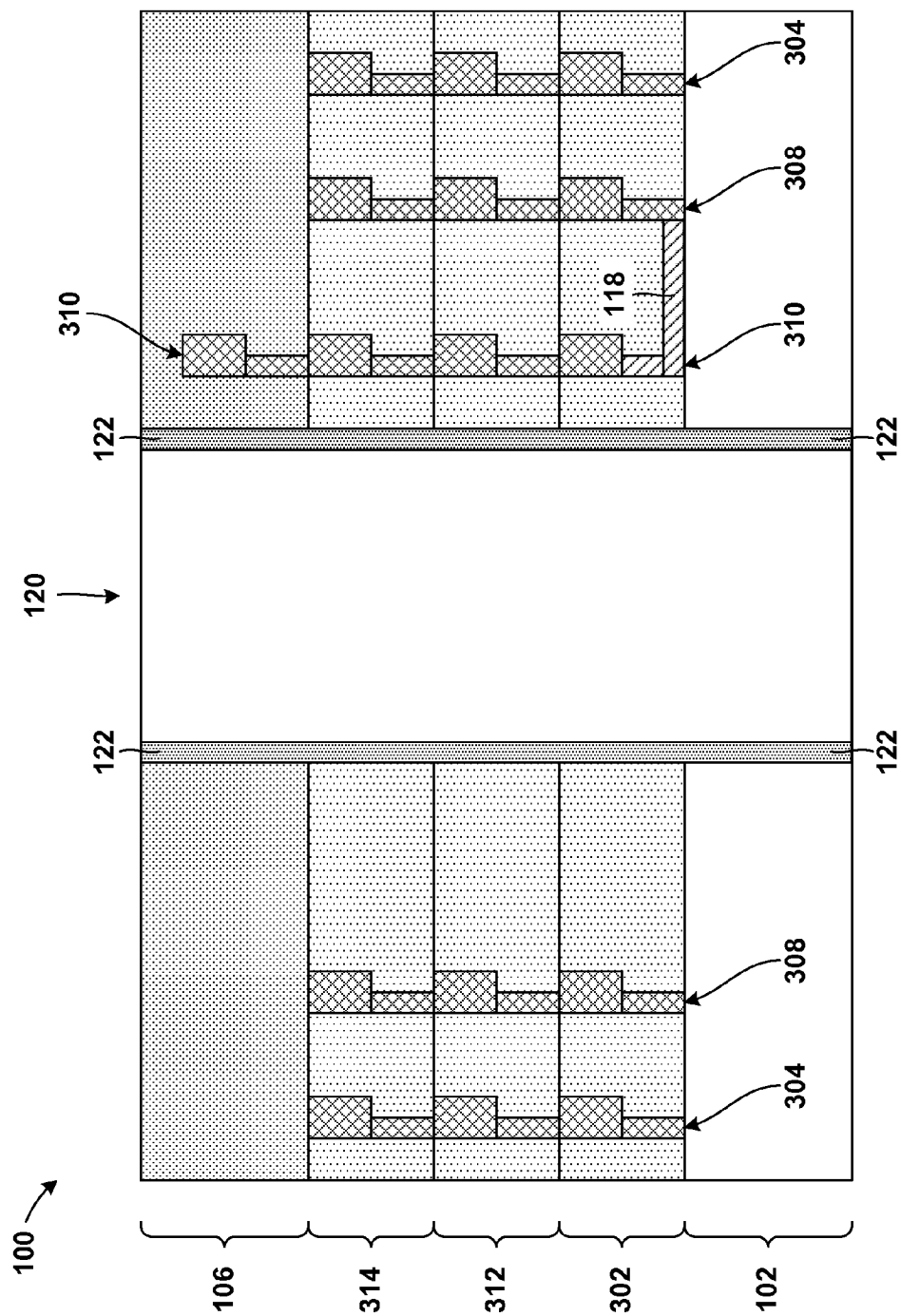
FIG. 14 illustrates forming a TSV opening, according to an exemplary embodiment.

At step 208, and as shown in FIG. 14, the TSV opening 120 may be formed in the open area 316 (FIG. 13), within the guard ring portions 308. Additionally, the first liner 122 may be formed by conventional means. It should be noted that the e-fuse portions 310 are located between the guard ring portions 308 and the TSV opening 120.

Figure 15:
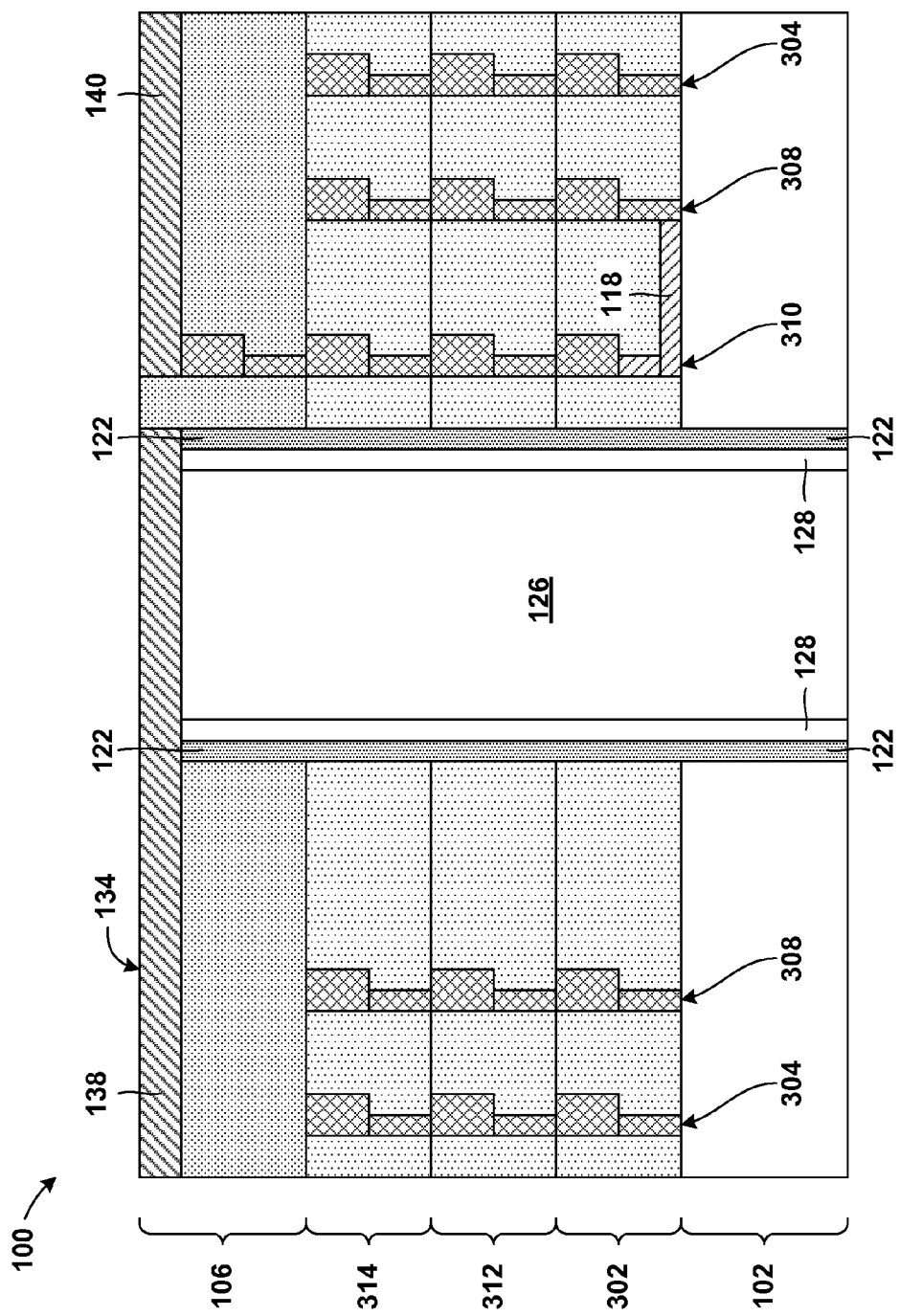
FIG. 15 illustrates forming a TSV, a TSV wire, and an e-fuse wire according to an exemplary embodiment.

At step 210, and as shown in FIG. 15, the conductive material, for example copper, may be deposited within and substantially fill the TSV opening 120 (FIG. 14) to form the TSV 126. Like above, the optional liner 128 may be included, as shown in the figure. Additional e-fuse portions 310 may be formed to extend into the far back end portion 106 and electrically connect with the e-fuse wire 140 formed above as illustrated according to known techniques. Also, the TSV wire 138 may be formed to create an electrical connection to the TSV 126. Semiconductor processing may then proceed in a conventional manner.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
forming a back end of the line (BEOL) wiring portion directly on top of a semiconductor base portion, the BEOL wiring portion comprising a plurality of layers of a metallic material and a dielectric material and excluding a semiconductor material;
forming a through-substrate via opening through the BEOL wiring portion and the semiconductor base portion;
forming an electronic fuse in the BEOL wiring portion adjacent to the through-substrate via opening;
forming a guard ring in the BEOL wiring portion surrounding the through-substrate via opening and the electronic fuse in the BEOL wiring portion, the through-substrate via opening in the semiconductor base portion being free from the guard ring;
diffusing water into the BEOL wiring portion through a sidewall of the through-substrate via opening; and
forming a through-substrate via (TSV) within the through-substrate via opening.

2. The method of claim 1, wherein forming an electronic fuse in the BEOL wiring portion comprises:
forming a fuse link, a first electrode, and a second electrode, wherein the fuse link is formed in the dielectric material of the BEOL wiring portion.

3. The method of claim 1, wherein forming the electronic fuse in the BEOL wiring portion comprises:
forming a fuse link, a first electrode, and a second electrode, the second electrode is electrically coupled to the guard ring.

4. The method of claim 1, wherein forming the electronic fuse in the BEOL wiring portion comprises:
forming a fuse link, a first electrode, and a second electrode, the first electrode and the second electrode are electrically independent from both the guard ring and the through-substrate via.

5. The method of claim 1, wherein forming the electronic fuse in the BEOL wiring portion comprises:
forming a fuse link, a first electrode, and a second electrode, the first electrode is electrically coupled to the through-substrate via.

6. The method of claim 1, wherein forming the electronic fuse in the BEOL wiring portion comprises:
forming a fuse link, a first electrode, and a second electrode, each comprising a plurality of solid metallic portions stacked in the BEOL wiring portion such that the electronic fuse is a continuous metallic structure.

7. The method of claim 1, wherein the guard ring is spaced apart from the electronic fuse, the guard ring is spaced apart from the through-substrate via, and the electronic fuse is spaced apart from the through-substrate via.

8. A method comprising:
forming a back end of the line (BEOL) wiring portion directly on top of a semiconductor base portion, the BEOL wiring portion comprising a plurality of layers of a metallic material and a dielectric material and excluding a semiconductor material;
forming a first opening in the BEOL wiring portion;
forming a second opening in the BEOL wiring portion adjacent to and surrounded by the first opening, the first opening and the second opening being separated by a distance;
filling the first opening with a material to form a guard ring;
filling the second opening with the material to form an electronic fuse;
forming a through-substrate via opening through the BEOL wiring portion and the semiconductor base portion, the through-substrate via opening being surrounded entirely by the guard ring, the through-substrate via opening through the semiconductor base portion being free of the guard ring;
forming a liner on the through-substrate via opening, wherein forming the liner causes water diffusion into the BEOL wiring portion through a sidewall of the through-substrate via opening; and
depositing metallization in the through-substrate via opening to form a through-substrate via.

9. The method of claim 8, wherein filling the second opening with the material to form an electronic fuse comprises:
forming a fuse link, a first electrode, and a second electrode, the fuse link is formed in plurality of layers of the metallic material and the dielectric material immediately above the semiconductor base portion.

10. The method of claim 8, wherein the electronic fuse is electrically connected to the guard ring.

11. The method of claim 8, wherein the electronic fuse is electrically independent from the guard ring and the through-substrate via.

12. The method of claim 8, wherein the electronic fuse is electrically connected to the through-substrate via.

13. The method of claim 9, wherein the electronic fuse and the guard ring each comprise a plurality of solid metallic portions stacked in the BEOL wiring portion such that the electronic fuse and the guard ring are each a continuous metallic structure.

14. A structure comprising:
a semiconductor base portion comprising a semiconductor material;
a back end of the line (BEOL) wiring portion directly on top of the semiconductor base portion, the BEOL wiring portion comprising a plurality of layers of a metallic material and a dielectric material and excluding a semiconductor material, wherein the BEOL wiring portion includes diffused water therein;
a through-substrate via extending through the BEOL wiring portion and the semiconductor base portion;
an electronic fuse in the BEOL wiring portion adjacent to the through-substrate via, the electronic fuse and the through-substrate via are separated by a distance; and
a guard ring in the BEOL wiring portion surrounding both the through-substrate via and the electronic fuse, the through-substrate via in the semiconductor base portion being free from the guard ring.

15. The structure of claim 14, wherein the electronic fuse comprises a fuse link, a first electrode, and a second electrode, and the fuse link is in plurality of layers of the metallic material and the dielectric material.

16. The structure of claim 14, wherein the electronic fuse comprises a fuse link, a first electrode, and a second electrode, and the second electrode is electrically coupled to the guard ring.

17. The structure of claim 14, wherein the electronic fuse comprises a fuse link, a first electrode, and a second electrode, and the first electrode and the second electrode are electrically independent of both the guard ring and the through-substrate via.

18. The structure of claim 14, wherein the electronic fuse comprises a fuse link, a first electrode, and a second electrode, and the first electrode is electrically coupled to the through-substrate via.

19. The structure of claim 14, wherein the electronic fuse comprises a fuse link, a first electrode, and a second electrode each comprising a plurality of solid metallic portions stacked in the BEOL wiring portion such that the electronic fuse is a continuous metallic structure.

20. The structure of claim 14, wherein the guard ring is spaced apart from the electronic fuse, the guard ring is spaced apart from the through-substrate via, and the electronic fuse is spaced apart from the through-substrate via.

* * * * *